(12) United States Patent
Simsek-Ege et al.

(10) Patent No.: US 9,064,970 B2
(45) Date of Patent: Jun. 23, 2015

(54) MEMORY INCLUDING BLOCKING DIELECTRIC IN ETCH STOP TIER

(71) Applicant: Micron Technology, Inc., Boise, ID (US)

(72) Inventors: Fatma Arzum Simsek-Ege, Boise, ID (US); John Hopkins, Boise, ID (US); Srikant Jayanti, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/864,794

(22) Filed: Apr. 17, 2013

(65) Prior Publication Data

US 2014/0264542 A1  Sep. 18, 2014

Related U.S. Application Data

(60) Provisional application No. 61/792,005, filed on Mar. 15, 2013.

(51) Int. Cl.
| | |
|---|---|
| *H01L 27/115* | (2006.01) |
| *H01L 29/792* | (2006.01) |
| *H01L 29/66* | (2006.01) |

(52) U.S. Cl.
CPC ...... *H01L 29/7926* (2013.01); *H01L 29/66833* (2013.01); *H01L 27/11556* (2013.01); *H01L 27/11582* (2013.01)

(58) Field of Classification Search
CPC ................... H01L 27/11582; H01L 27/11578; H01L 27/11556
USPC .................................................. 257/324–326
See application file for complete search history.

(56) References Cited

U.S. PATENT DOCUMENTS

| | | | | |
|---|---|---|---|---|
| 6,689,658 | B2 * | 2/2004 | Wu | 438/257 |
| 8,680,605 | B2 * | 3/2014 | Jeon et al. | 257/324 |
| 8,754,466 | B2 * | 6/2014 | Yun et al. | 257/324 |

* cited by examiner

*Primary Examiner* — John C Ingham
(74) *Attorney, Agent, or Firm* — Schwegman Lundberg & Woessner, P.A.

(57) ABSTRACT

Vertical memories and methods of making the same are discussed generally herein. In one embodiment, a vertical memory can include a vertical pillar extending to a source, an etch stop tier over the source, and a stack of alternating dielectric tiers and conductive tiers over the etch stop tier. The etch stop tier can comprise a blocking dielectric adjacent to the pillar. In another embodiment, the etch stop tier can comprise a blocking dielectric adjacent to the pillar, and a plurality of dielectric films horizontally extending from the blocking dielectric into the etch stop tier.

17 Claims, 17 Drawing Sheets

US 9,064,970 B2

MEMORY INCLUDING BLOCKING DIELECTRIC IN ETCH STOP TIER

CLAIM OF PRIORITY

This patent application claims the benefit of priority to U.S. Provisional Patent Application Ser. No. 61/792,005, filed on Mar. 15, 2013, which is hereby incorporated by reference herein in its entirety.

BACKGROUND

With the development of the semiconductor industry, three-dimensional (3D) semiconductor devices (e.g., 3D NAND memory devices) are widely explored. However, the structures of the 3D semiconductor devices that include multiple stacked tiers (e.g., layers) and high aspect ratio openings (e.g., holes) extending into the tiers, as well as the techniques of fabricating such 3D semiconductor devices, may present some implementation challenges.

DESCRIPTION OF THE EMBODIMENTS

The following detailed description refers to the accompanying drawings which show, by way of illustration, specific aspects and embodiments in which the present subject matter may be practiced. These embodiments are described in sufficient detail to enable those skilled in the art to practice the present subject matter.

The term "horizontal" as used in this application is defined as a plane parallel to the conventional plane or surface of a wafer, such as a substrate, regardless of the actual orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the actual orientation of the wafer or substrate.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the present invention is defined only by the appended claims, along with the full scope of equivalents to which such claims are entitled.

A NAND array architecture is an array of memories (e.g., memory cells) arranged such that the memories of the array are coupled in logical rows to access lines (which are coupled to, and in some cases are at least partially formed by, the Control Gates (CGs) of the memories, which are conventionally referred to as word lines. Some memories of the array are coupled together in series between a source line and the data line, which is conventionally referred to as a bit line.

Memory cells in NAND array architecture can be programmed to a desired data state. For example, electric charge can be accumulated (e.g., placed) on, or removed from, a FG of a memory cell to program the cell into a desired one of a number of data states. A memory cell conventionally referred to as a single level cell (SLC) can be programmed to a desired one of two data states, e.g., a "1" or a "0" state. Memory cells conventionally referred to as multilevel cells (MLCs) can be programmed to a desired one of more than two data states.

Discussed herein are vertical memories, memory arrays, and methods of making the same.

Figure 1:
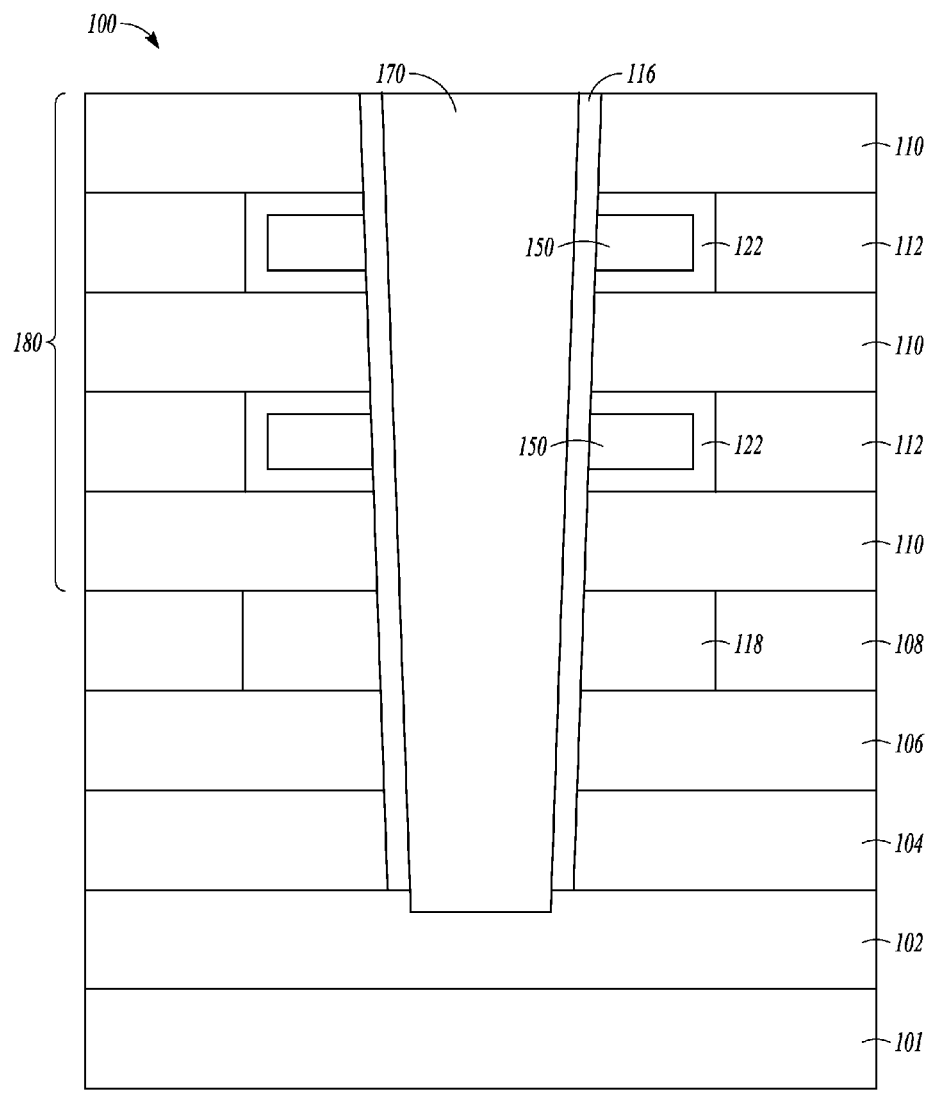
FIG. 1 illustrates a cross-sectional view of an example of a vertical memory according to an embodiment.

FIG. 1 illustrates a cross-sectional view of an example of a vertical memory 100 according to an embodiment.

In some embodiments, as shown in FIG. 1, a vertical memory 100 may include a source (e.g., doped polysilicon (poly) or Tungsten Silicide (WSiX)) 102, a separation tier (e.g., oxide such as silicon oxide) 104 on the source 102, a select gate source (SGS) (e.g., P-type poly) 106 on the separation tier 104, an etch stop (ES) tier (e.g., ALOX) 108 on the select gate source 106, a stack 180 of alternating dielectric tiers (e.g., oxide such as silicon oxide) 110 and conductive tiers (e.g., N-type poly) 112 on the etch stop tier 108, and a vertical pillar (e.g., poly) 170 extending from a top surface of the vertical memory 100 to the source 102. The vertical pillar 170 may include a channel (e.g., poly) and a sidewall 116 of the channel. As shown in FIG. 1, the vertical memory 100 may be formed on a substrate 101. For simplicity, the substrate 101 is not shown in some figures such as FIGS. 3A-3M, and 4A.

In some embodiments, as shown in FIG. 1, the etch stop tier (e.g., ALOX) 108 may comprise a blocking dielectric (e.g., backfill oxide such as silicon oxide) 118 adjacent to the pillar 170. The blocking dielectric 118 may reduce or even prevent undercut and/or delamination issues, which may happen to the etch stop layer 108 when the etch stop layer 108 is exposed to Hot Phosphoric Acid (Hotphos) or Hydrofluoric Acid (HF).

In some embodiments, as shown in FIG. 1, a conductive tier 112 of the stack 180 may include a Control Gate (CG) (e.g., poly), a charge storage structure (e.g., poly) 150 adjacent to the pillar 170, and a barrier film 122 between the CG 112 and the charge storage structure 150. The charge storage structure 150 may be a Floating Gate (FG). In some embodiments, the barrier film 122 may comprise a dielectric (e.g., Oxide-Nitride-Oxide (ONO) Inter-Poly-Dielectric (IPD), or oxide).

Figure 2:
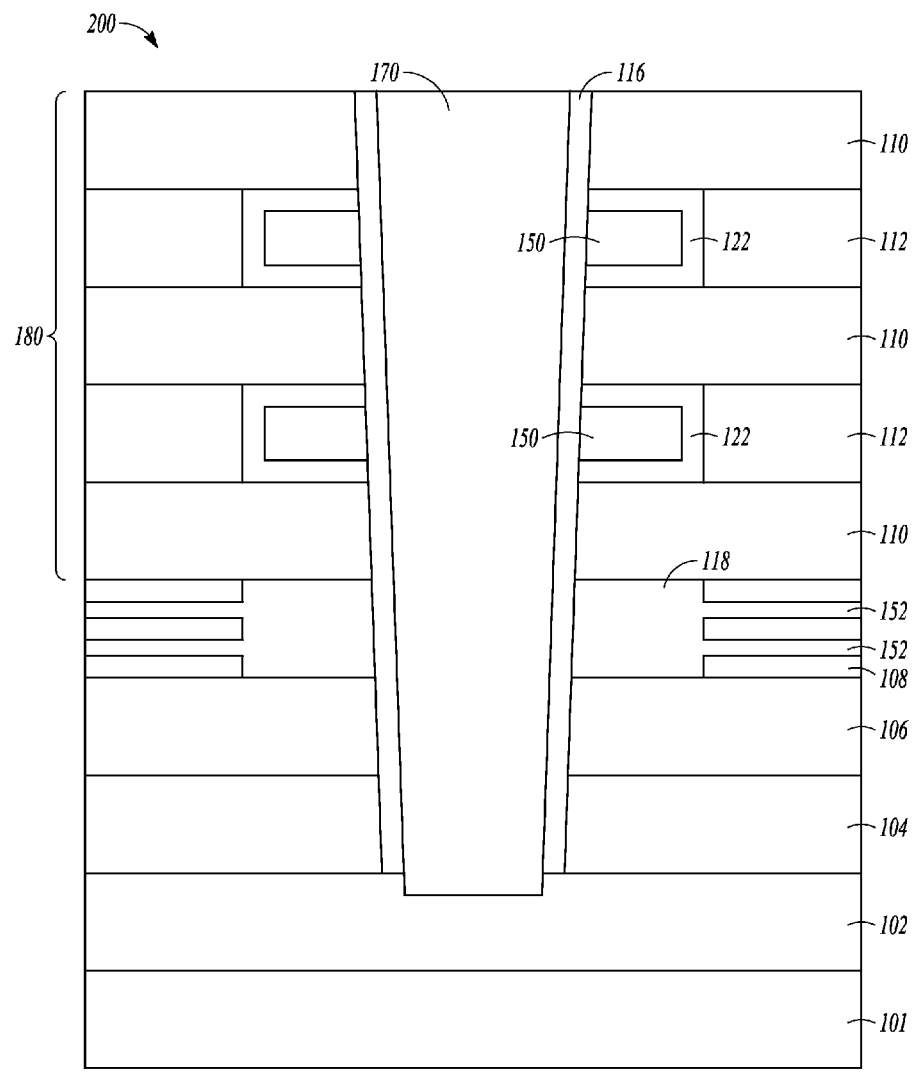
FIG. 2 illustrates a cross-sectional view of another example of a vertical memory according to an embodiment.

FIG. 2 illustrates a cross-sectional view of another example of a vertical memory 200 according to an embodiment.

A vertical memory 200 may include elements similar to or identical to those of the vertical memory 100. For simplicity, similar or identical elements of the vertical memory 200 are given the same designation numbers as given to vertical memory 100. As shown in FIG. 2, the vertical memory 200 may be formed on a substrate 101.

In some embodiments, as shown in FIG. 2, the etch stop tier 108 may comprise a blocking dielectric (e.g., backfill oxide such as silicon oxide) 118 adjacent to the pillar 170, and a plurality of dielectric films (e.g., oxide) 152 that horizontally extend from the blocking dielectric 118 into the etch stop tier 108. The blocking dielectric 118 and the dielectric films 152 in the etch stop layer 108 may reduce or even prevent undercut and/or delamination issues, which may happen to the etch stop layer 108 when the etch stop layer 108 is exposed to Hot Phosphoric Acid or Hydrofluoric Acid. With the oxide films 152 inserted in the ALOX of the etch stop tier 108, the control of the recesses and deposition profile can be improved. For example, the oxide films 152 may help oxide backfill processes if needed. The oxide films 152 may also be used as to eliminate ALOX of the etch stop layer 108 exposure to Hot Phosphoric Acid or Hydrofluoric Acid.

In some embodiments, an IPD (not shown in the figures) may exist as a gap filled within the blocking dielectric (e.g., oxide) 118 and ALOX portions of the Etch Stop layer 108. During the making process, the IPD has been removed by a large amount, but not fully removed in the gaps between ALOX and Oxide layers, where ALOX has been recessed more than the sandwich oxide.

FIG. 3A to FIG. 3M illustrate cross-sectional views of the vertical memory 100 during some processes of an example technique of making the vertical memory 100 according to an embodiment.

Figure 3A:
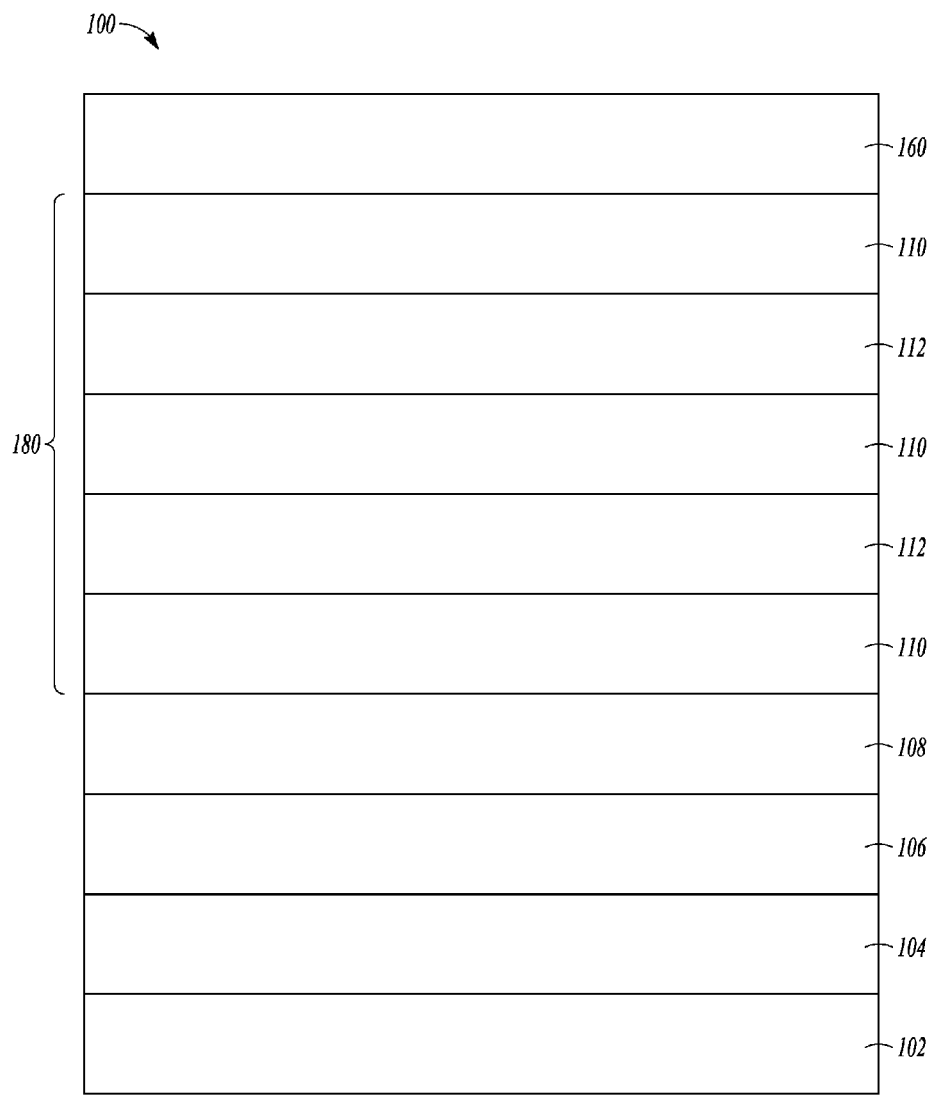
FIG. 3A to FIG. 3M illustrate cross-sectional views of a vertical memory during some processes of an example technique of making the vertical memory according to an embodiment.

FIG. 3A shows the vertical memory 100 after a formation of a separation dielectric (e.g., oxide) 104 on a source (e.g., doped poly or WSiX) 102, a select gate source (P-type poly) 106 on the separation dielectric 104, an etch stop tier (e.g., ALOX) 108 on the select gate source 106, and a stack 180 of alternating dielectric tiers (e.g., oxide) 110 and conductive tiers (e.g., N-type poly) 112 on the etch stop tier 108.

In some embodiments, a film 160 (e.g., nitride) may be formed on a top dielectric tier of the dielectric tiers 110 as a Chemical Mechanical Polish (CMP) stop tier.

Figure 3B:
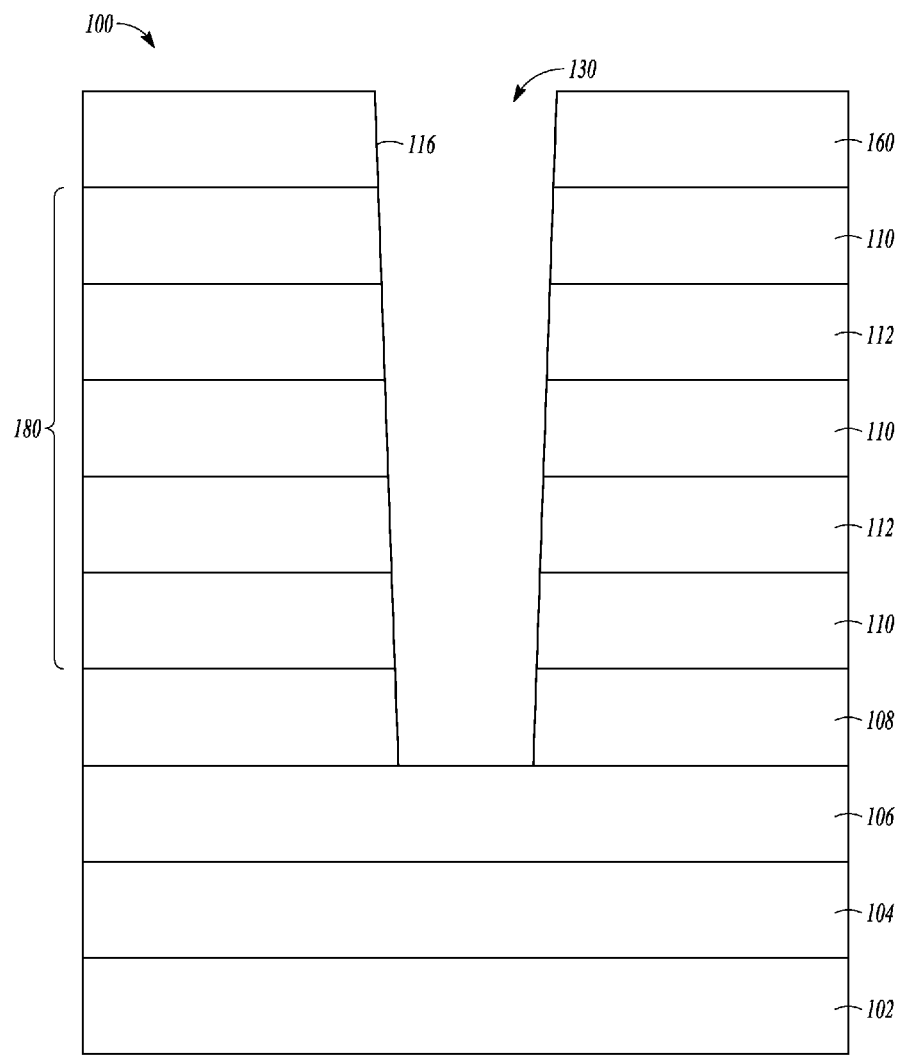

FIG. 3B shows the vertical memory 100 after a formation of a vertical trench (e.g., opening) 130, which extends from a top surface of the vertical memory 100 into the etch stop tier 108. The film 160 may be used as a hard mask for etching the vertical trench 130.

Figure 3C:
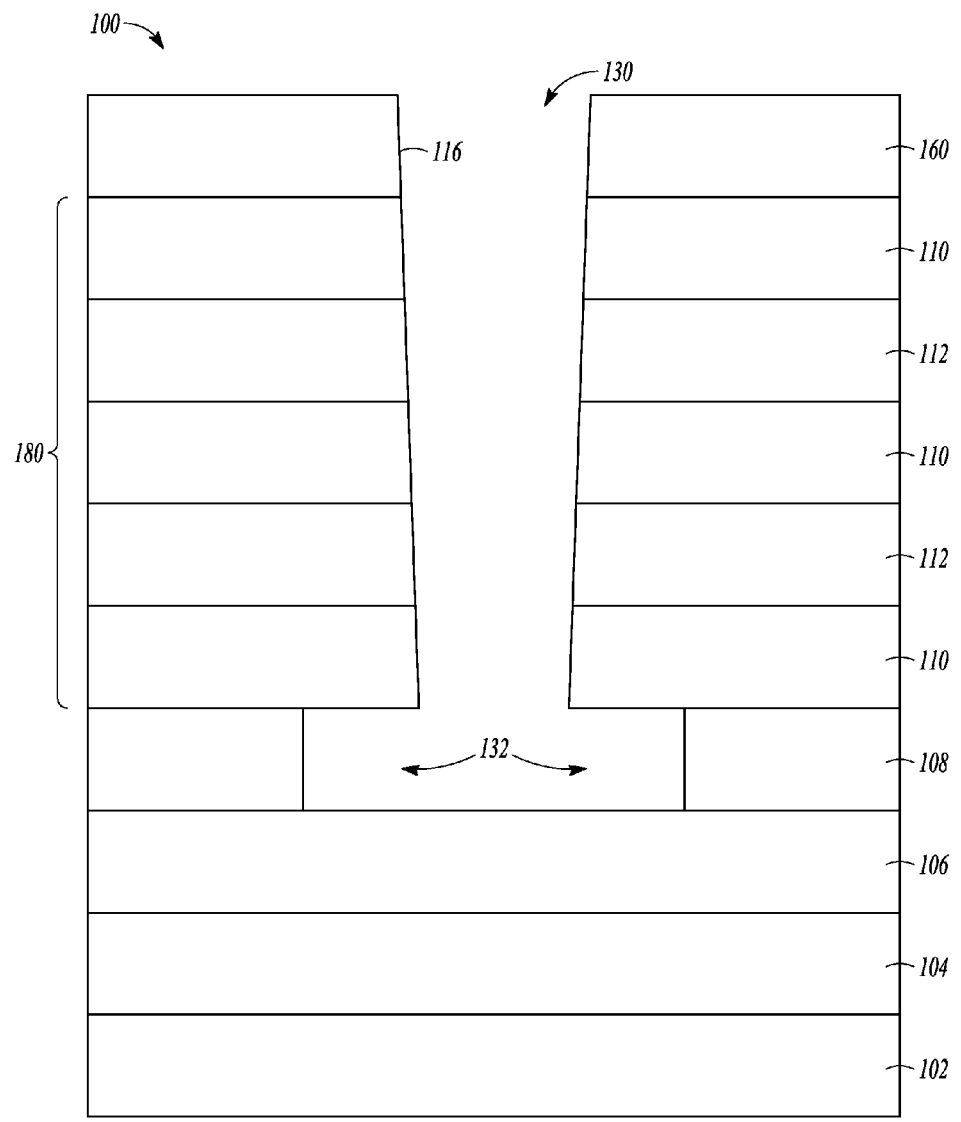

FIG. 3C shows the vertical memory 100 after recesses 132 have been formed into the etch stop tier 108. Forming recesses 132 may include removing (e.g., by horizontally etching) a portion of the etch stop tier 108 adjacent to the trench 130. Removing the portion of the etch stop tier 108 may include using Hydrofluoric Acid to remove the portion.

Figure 3D:
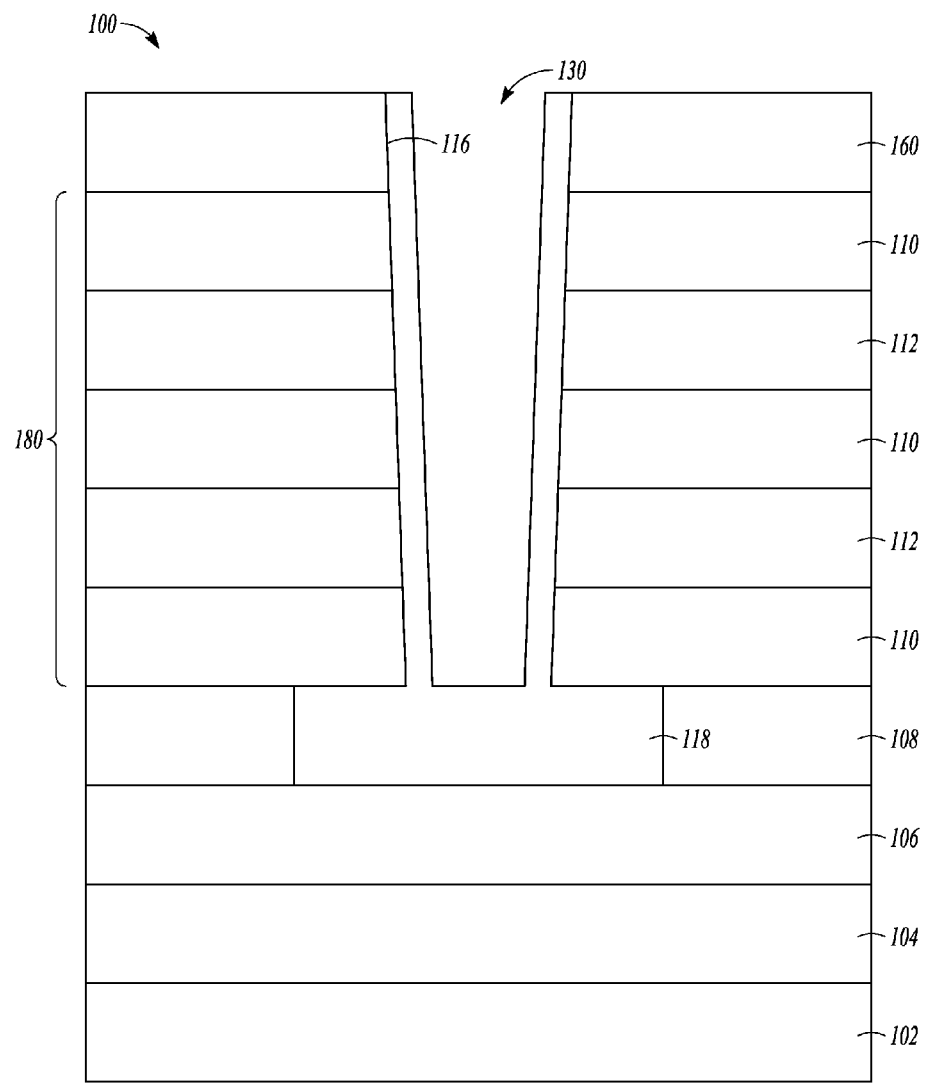

FIG. 3D shows the vertical memory 100 after a blocking dielectric 118 has been formed by filling the recesses 132 with a backfill dielectric (e.g., oxide such as silicon oxide). The blocking dielectric 118 may be applied by utilizing a High Aspect Ratio Process (HARP) or a High Temperature Process (HTP). As shown in FIG. 3D, the sidewall 116 of the trench 130 may also be covered by the backfill dielectric 118.

Figure 3E:
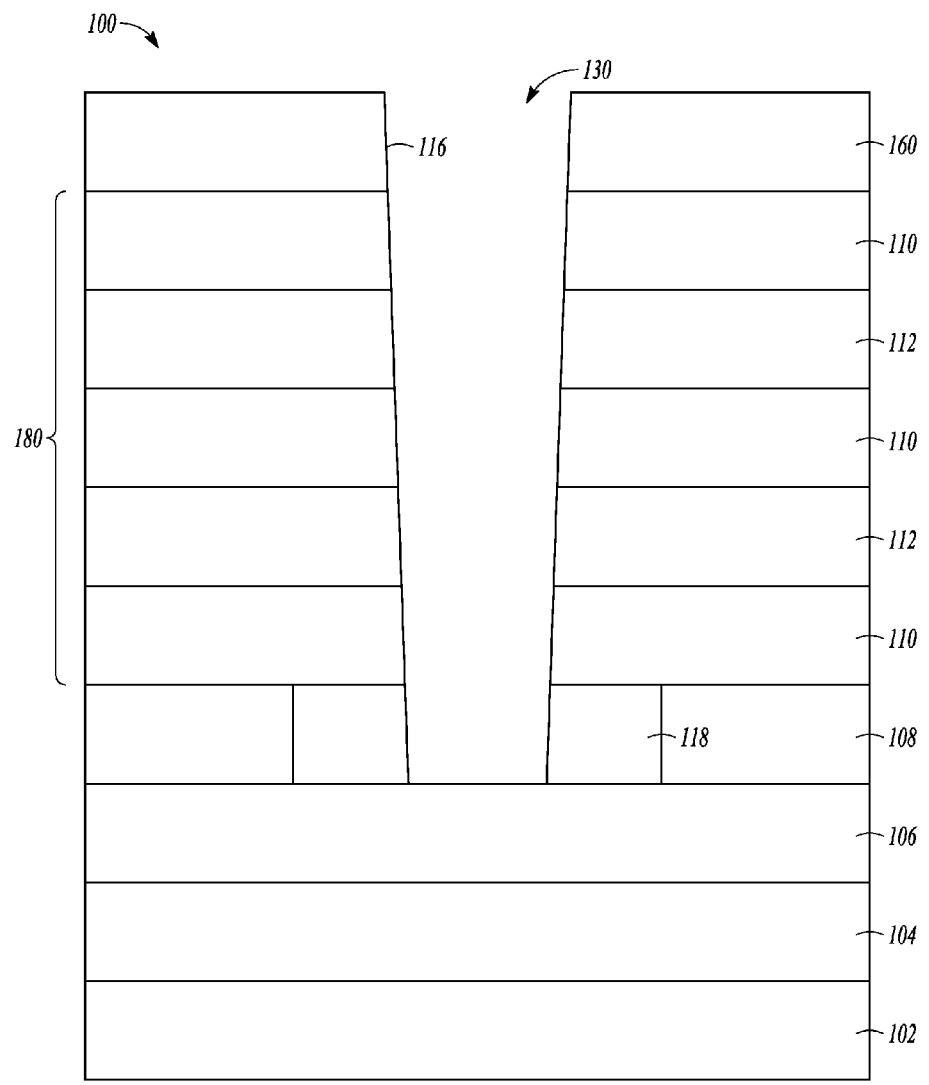

FIG. 3E shows the vertical memory 100 after the blocking dielectric 118 has been removed from the sidewall 116 and bottom of the trench 130, with the blocking dielectric 118 being left in the recesses 132 in the etch stop tier 108. Thus, the blocking dielectric 118 adjacent to the vertical trench 130 is formed in the etch stop tier 108. The wet etch rate of the blocking dielectric 118 in hot phosphoric acid and/or hydrofluoric acid is substantially lower than the wet etch rate of ALOX of the etch stop tier 108.

Figure 3F:
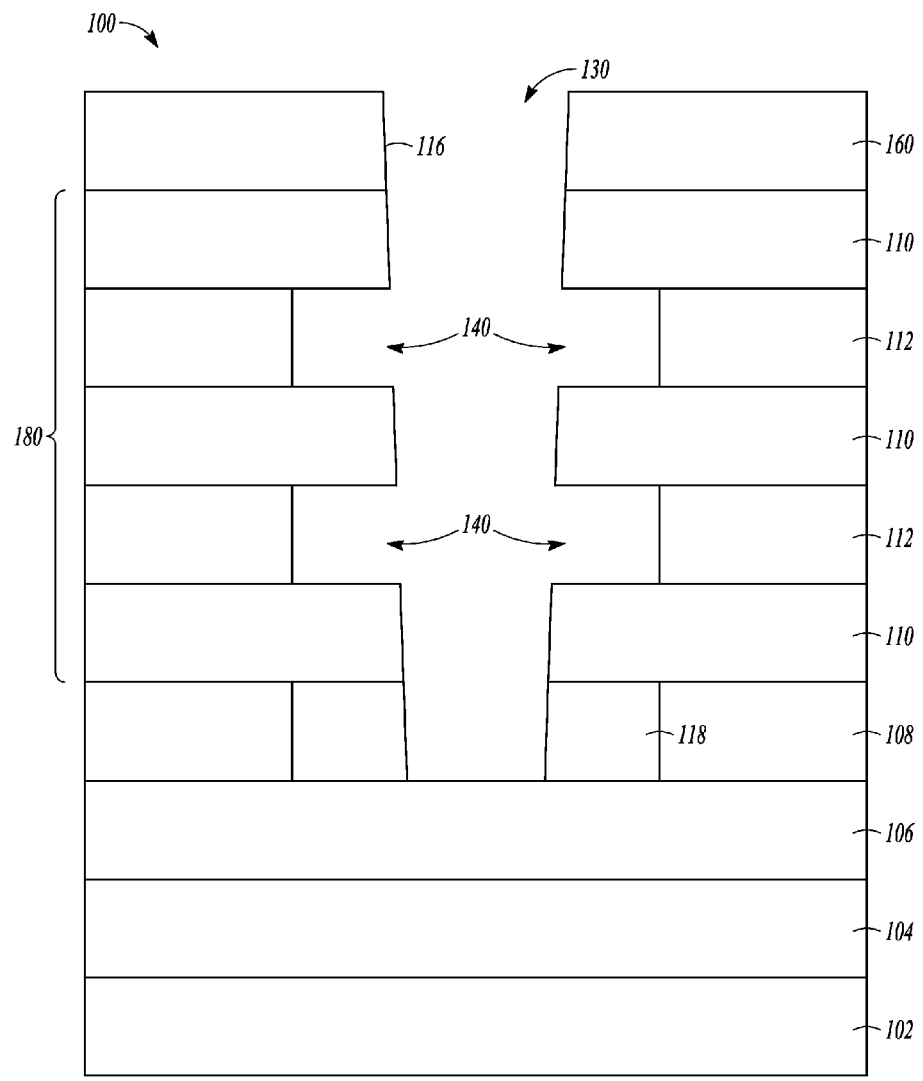

FIG. 3F shows the vertical memory 100 after FG recesses 140 have been formed in a conductive tier 112 of the stack 180 adjacent to the trench 130. In some embodiments, forming the FG recesses 140 may include removing a portion of a conductive tier 112 of the stack 180 adjacent to the trench 130, e.g., by utilizing a tetra methyl ammonium hydroxide (TMAH) to horizontally etch the portion.

Figure 3G:
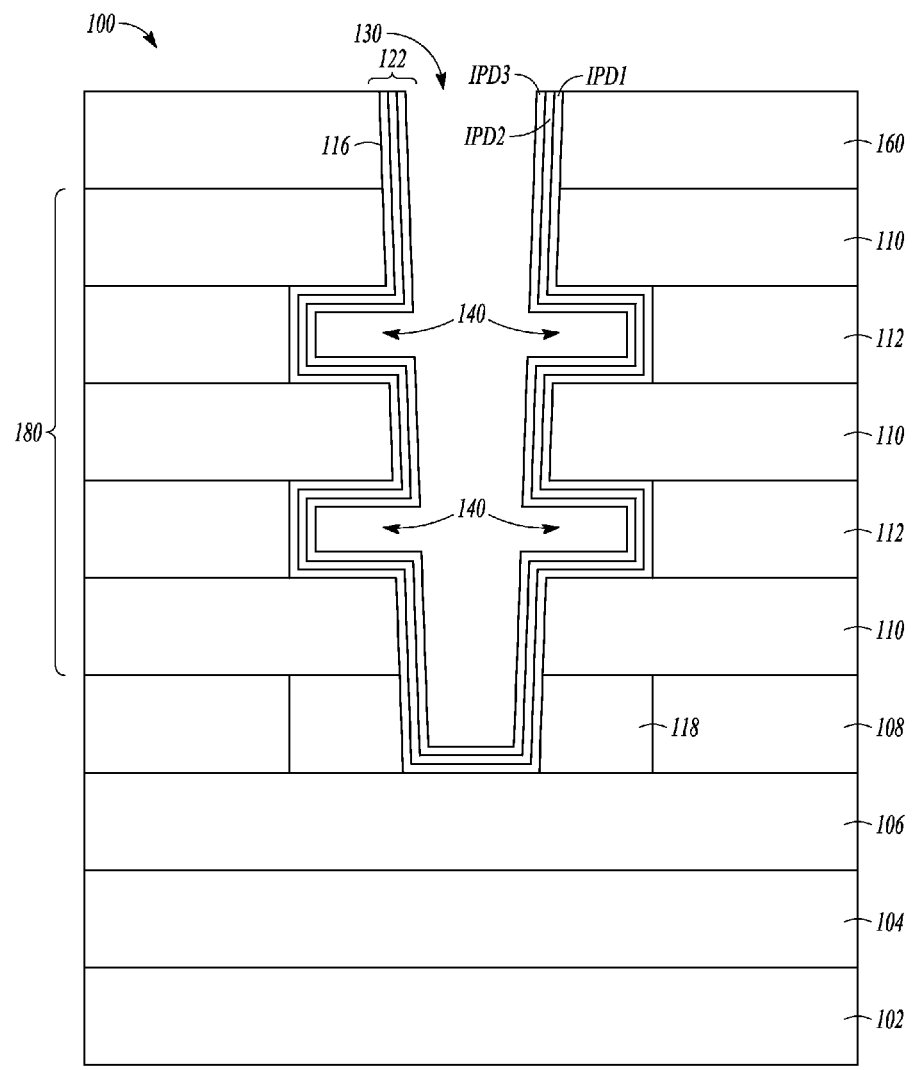

FIG. 3G shows the vertical memory 100 after a barrier film 122 has been formed on the FG recesses 140 and on the sidewall 116 of the trench 130. In some embodiments, the barrier film 122 includes an oxide-nitride-oxide (ONO) inter-poly dielectric (IPD) As shown in FIG. 3G, and viewed outwardly from the center of the trench 130, the IPD barrier film 122 may include three layers, such as an inner layer IPD1 (e.g., oxide) in contact with the sidewall 116 of the trench 130, an outer layer IPD3 (e.g., oxide) accessible to the trench 130, and a middle layer IPD2 (e.g., nitride) between the IPD1 and the IPD3. Forming the barrier film 122 may include forming the IPD1 on the sidewall 116 and bottom of the trench 130 and on FG recesses 140, forming the IPD2 on the IPD1, and forming the IPD3 on the IPD2.

In some embodiments, not shown in FIG. 3G, IPD1 (oxide) of the IPD barrier film 122 may not grow on the sidewall of tier oxide.

Figure 3H:
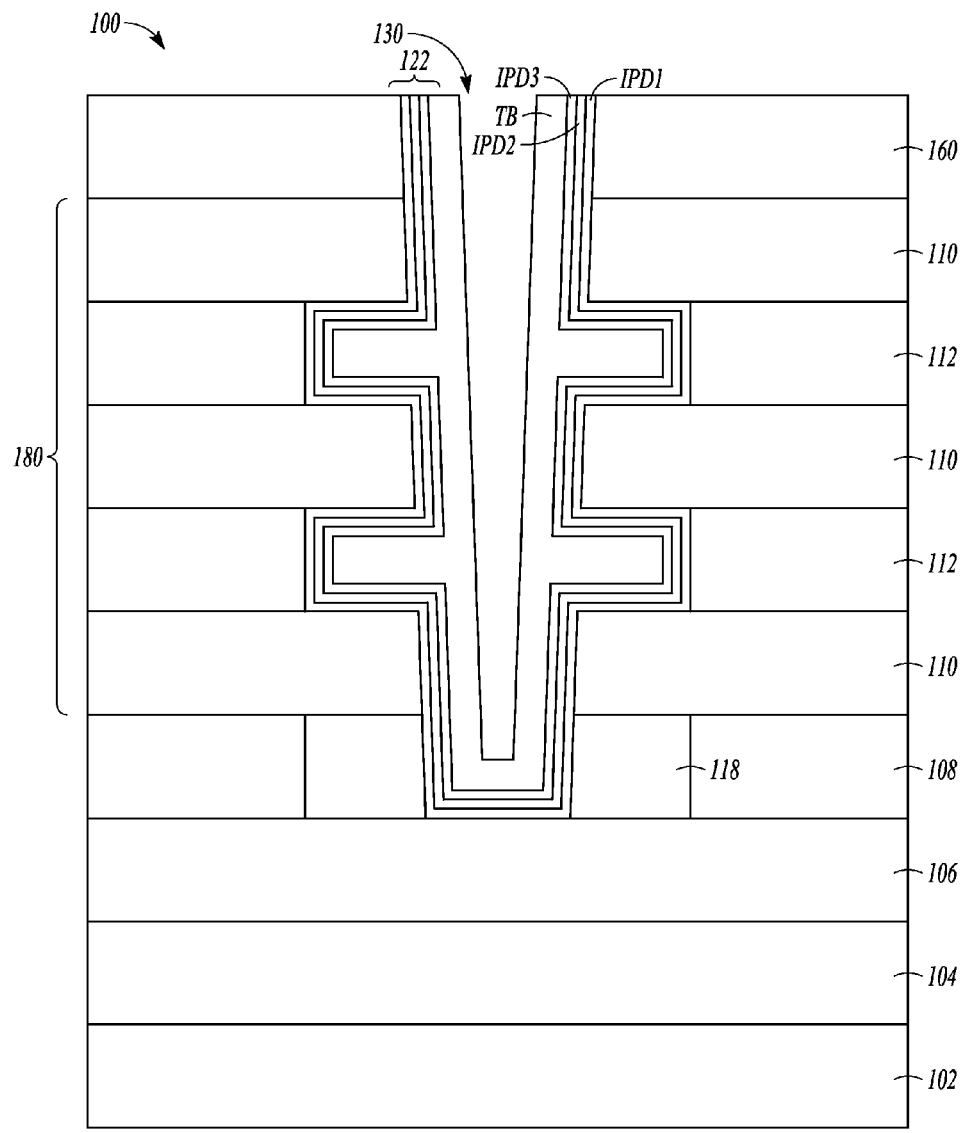

FIG. 3H shows the vertical memory 100 after the FGs 150 have been formed by filling the FG recesses 140 in the conductive tiers 112 of the stack 180 adjacent to the trench 130 with a trap base (TB) 150. In some embodiments, the trap base 150 may be deposited on the surface of the FG recesses 140 in the conductive tiers 112 of the stack 180 adjacent to the trench 130. As shown in FIG. 3H, the sidewall of the trench 130 may also be covered by the trap base.

Figure 3I:
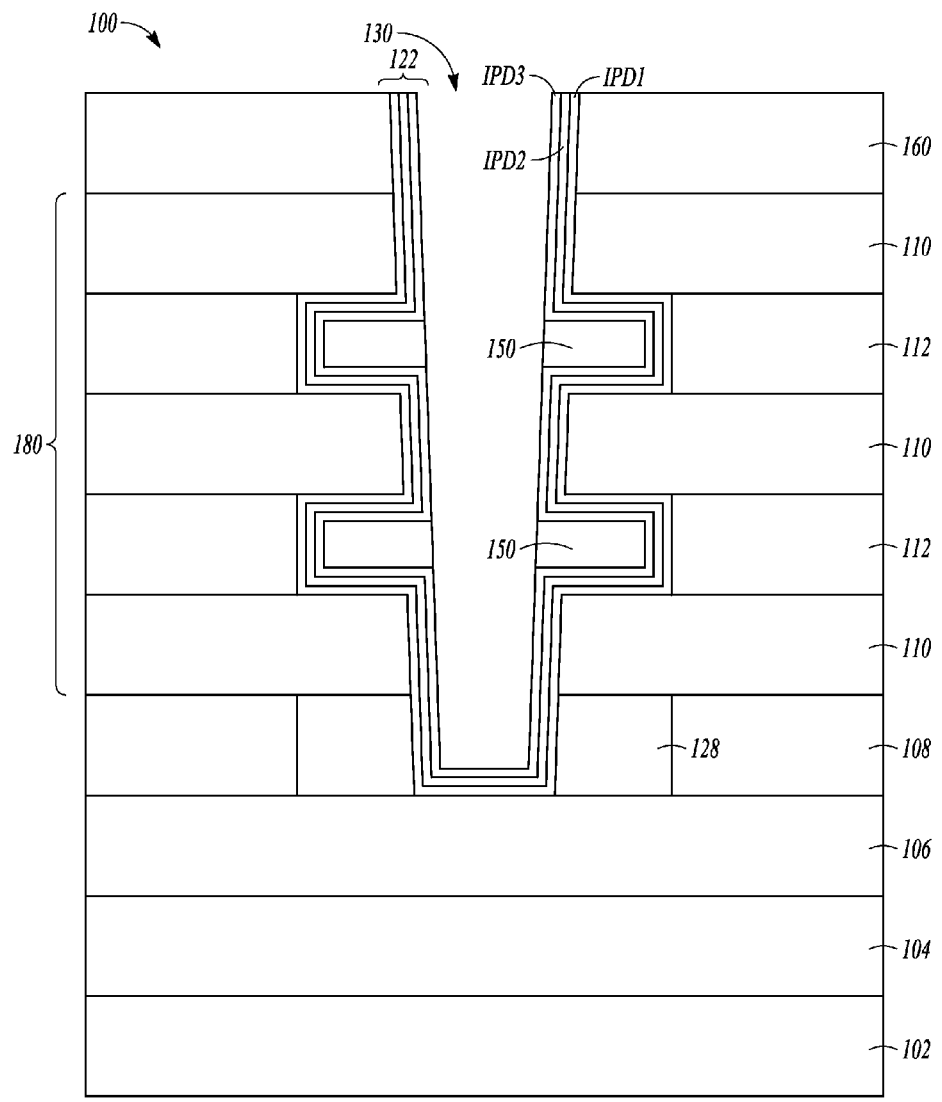

FIG. 3I shows the vertical memory 100 after the trap base 150 (as shown in FIG. 3H) has been removed from the sidewall and bottom of the trench 130, while leaving the trap base 150 in the FG recesses 140. Therefore, the FGs 150 are formed in the conductive tier 112 of the stack 180 adjacent to the trench 130.

Figure 3J:
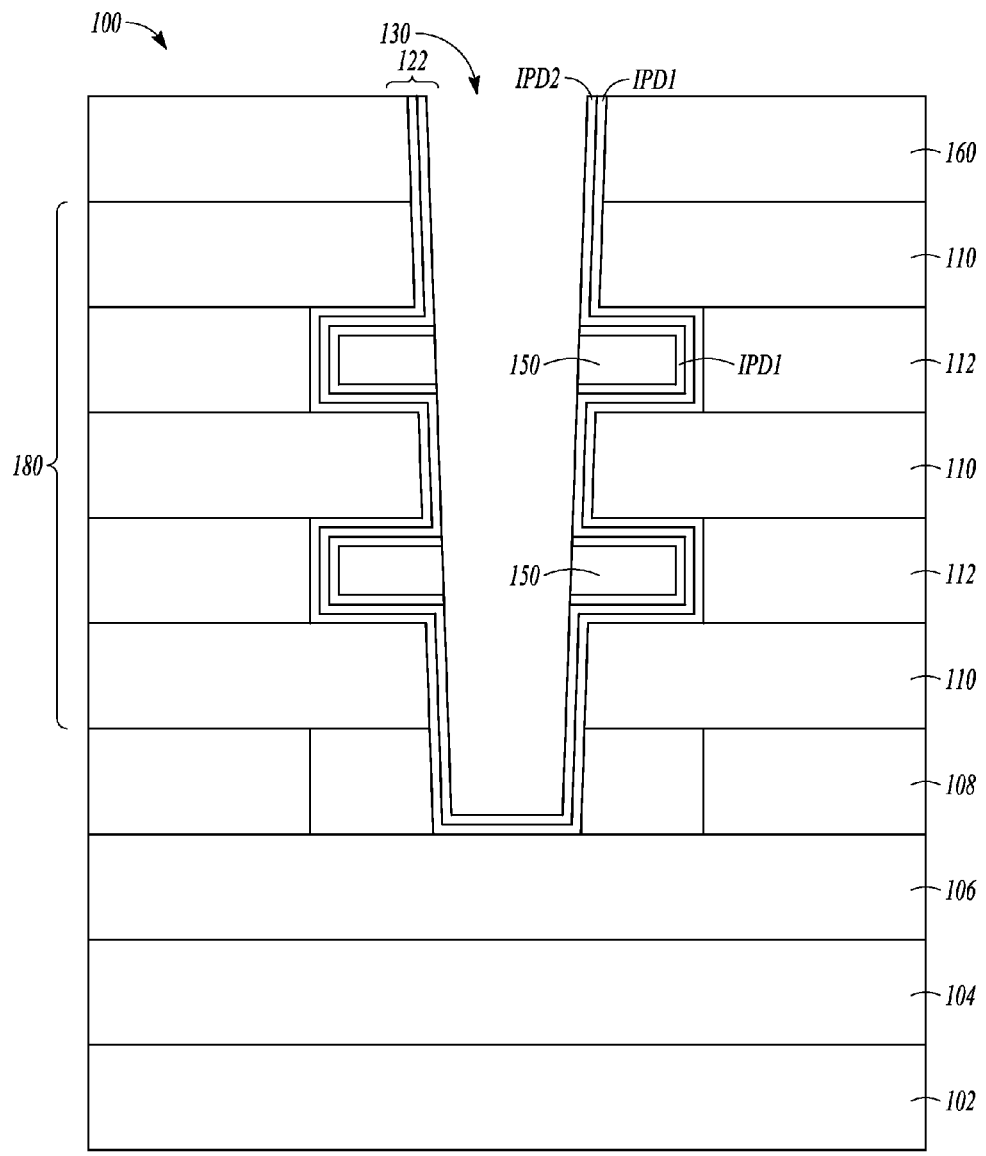

FIG. 3J shows the vertical memory 100 after the inner layer IPD3 (e.g., oxide) of the IPD barrier film 122 has been removed from the sidewall and bottom of the trench 130 (e.g., by using a wet chemistry).

Figure 3K:
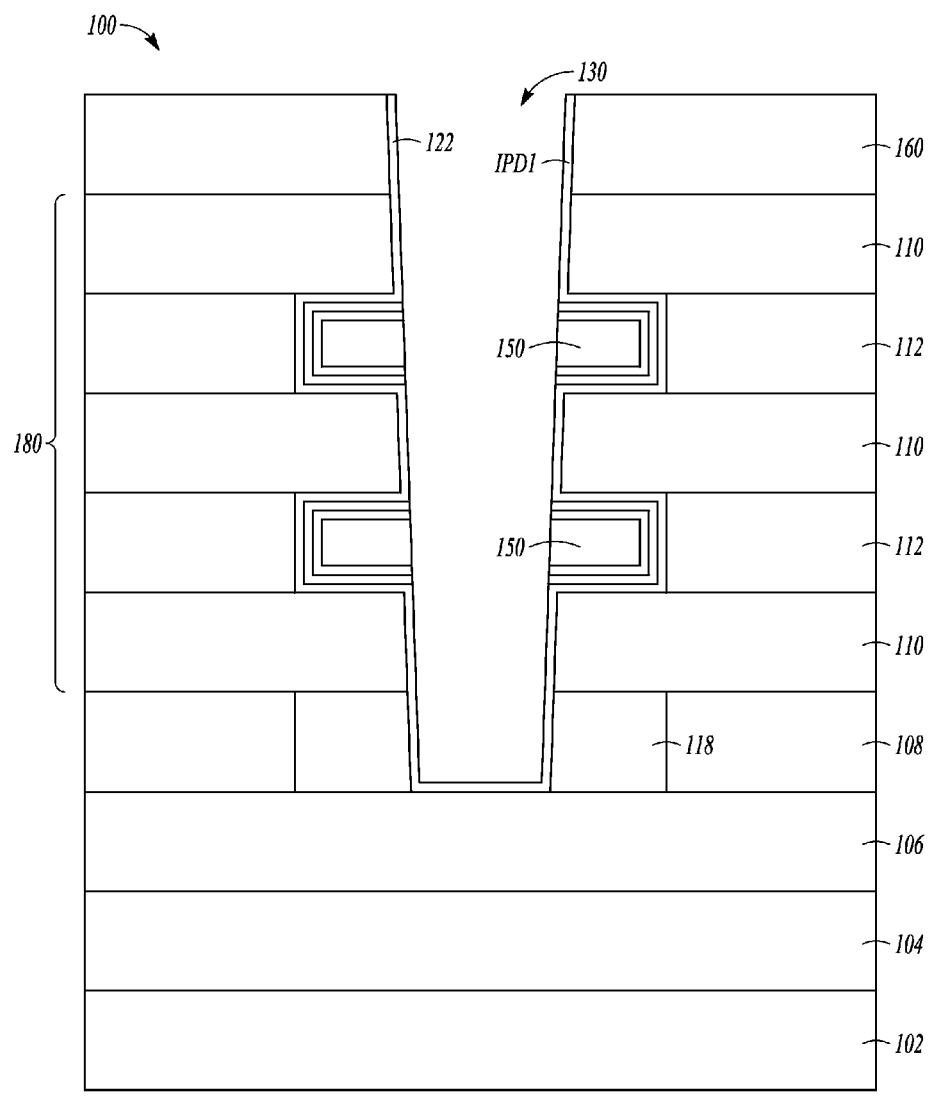

FIG. 3K shows the vertical memory 100 after the middle layer IPD2 (e.g., nitride) of the IPD barrier film 122 has been removed from the sidewall and bottom of the trench 130 by using either Hot Phosphoric Acid or HF Acid (e.g. 2000:1 HF). During the process of removing the middle layer IPD2, the blocking dielectric 118 covering the etch stop (e.g., ALOX) tier 108 may reduce or even prevent the removal of the ALOX from the etch stop tier 108. Without the blocking dielectric 118 covering the etch stop tier 108, Hot Phosphoric Acid or Hydrofluoric Acid may remove ALOX from the etch stop tier 108 when removing the middle layer IPD2 (e.g., nitride) from the sidewall of the trench 130, and thus may cause a delamination issue in the etch stop tier 108.

Figure 3L:
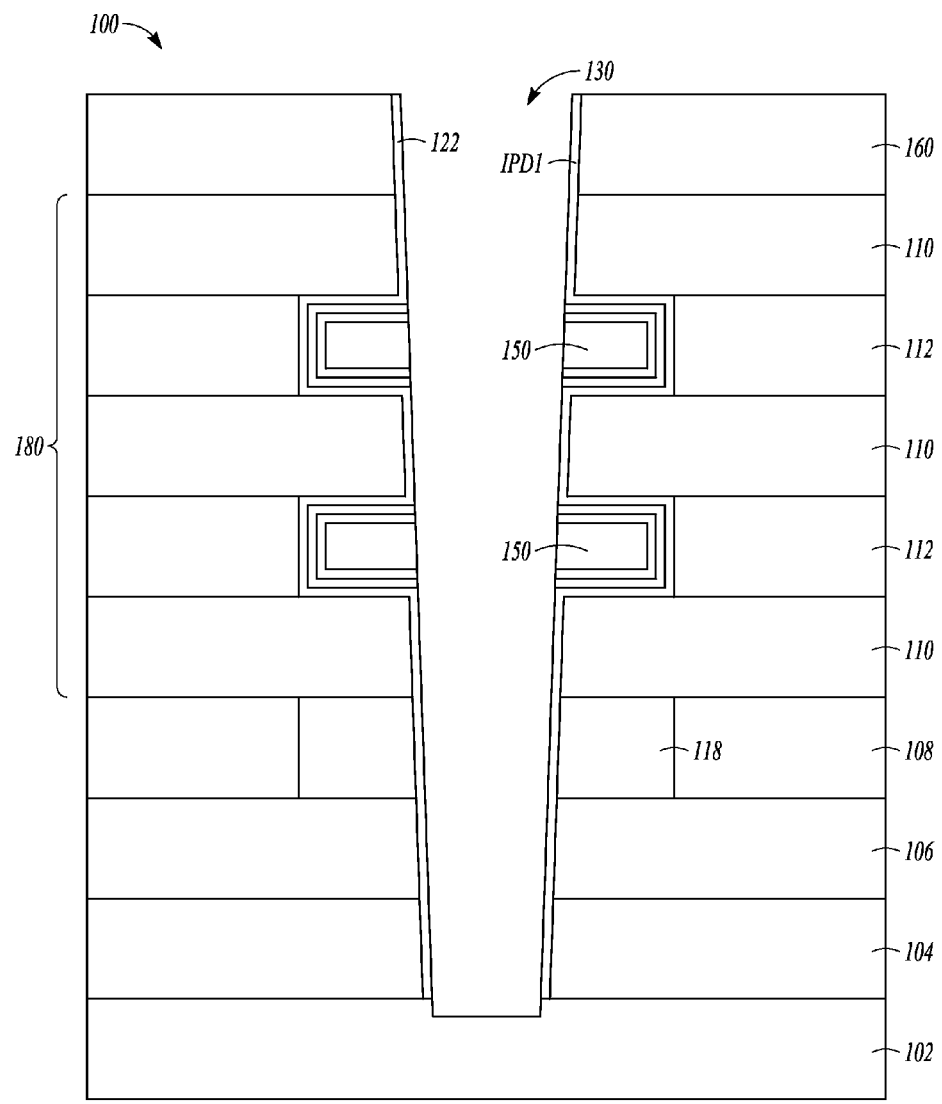

FIG. 3L shows the vertical memory 100 after (e.g., by etching) the trench 130 has been extended (e.g., through the select gate source 106 and the separation tier 104) to the source 102 by etching.

Figure 3M:
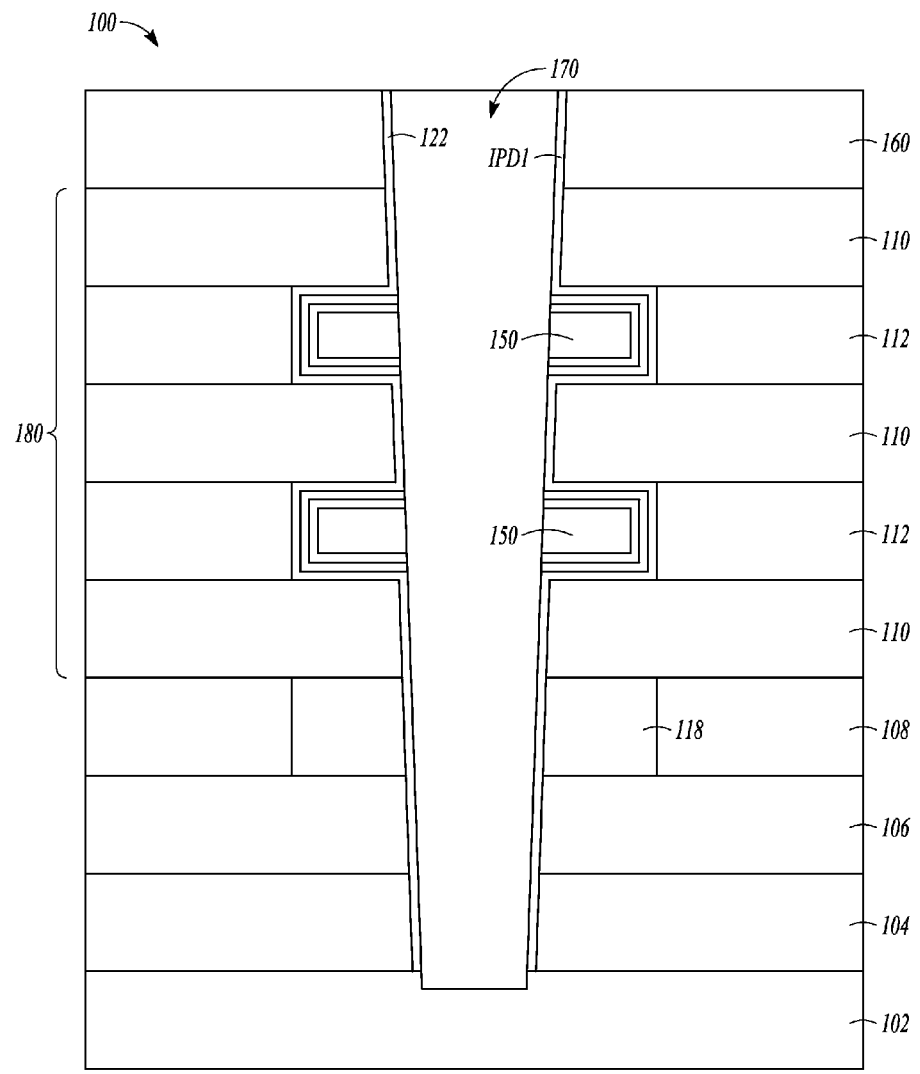

FIG. 3M shows the vertical memory 100 after the trench 130 has been filled with a conductive material (e.g., poly) to form the vertical pillar 170.

A vertical memory 100 as shown in FIG. 1 is therefore formed through e.g., the processes as shown in FIGS. 3A-3M. For example, during a process of fabricating a 3D semiconductor device, an etch stop layer, when exposed to some chemicals, may lead to undercut and/or delamination issues. Cell-pillar Etch Stop (ES) tiers (e.g., layers), such as Aluminum Oxide (ALOX), are generally not compatible with some chemicals that are used to remove trap-up materials (e.g., Oxide-Nitride-Oxide (ONO) Inter Poly Dielectric (IPD)) from a sidewall of a channel (e.g., pillar). The embodiments of the disclosure may reduce the undercut and/or delamination issues by using e.g., backfill dielectric (e.g., oxide) to block and thus protect the surface of the etch stop tier that is exposed to Hot Phosphoric Acid or Hydrofluoric Acid.

The disclosure relates to an integration of methodologies of IPD (e.g., ONO) sidewall removal from a channel and ALOX-like High K (HiK) etch stop tiers that are resistant to dry etch but easily soluble in wet etch process. IPD (e.g., IPD2 as shown in the figures) nitride removal from a channel is generally needed for reliability and cycling data retention. Etch stop tiers (e.g., ALOX) generally do not allow sidewall nitride removal from a channel because ALOX of the etch stop tiers are sensitive to Hot Phosphoric Acid and Hydrofluoric Acid. In some embodiments, the etch stop tier (e.g., ALOX) may include a blocking dielectric (e.g., a backfill oxide such as silicon oxide) adjacent to a pillar (e.g., poly) to block the etch stop tier from e.g., the Hot Phosphoric Acid and Hydrofluoric Acid.

In other embodiments, the etch stop tier may comprise a backfill oxide adjacent to the pillar, and a plurality of dielectric films (e.g., oxide) that horizontally extend (or insert) from the backfill oxide into the etch stop tier. The backfill oxide may allow the trap-up nitride removal from a sidewall of the channel.

Figure 4:
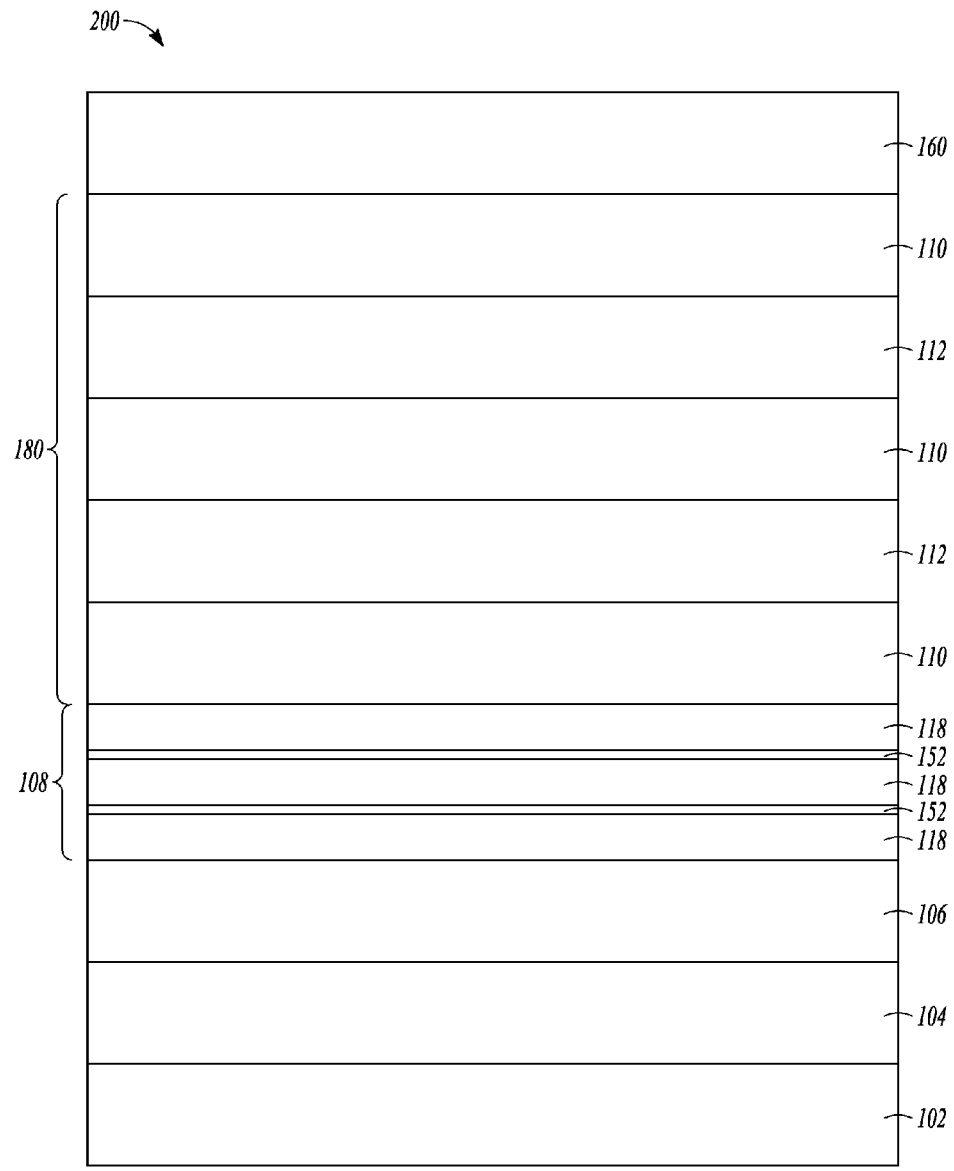
FIG. 4 illustrates a cross-sectional view of a vertical memory during some processes of another example technique of making another vertical memory according to an embodiment.

FIG. 4 illustrates a cross-sectional view of a vertical memory 200 (as shown in FIG. 2) during some processes of another example technique of making a vertical memory according to an embodiment. As shown in FIG. 2, in addition to a block dielectric (e.g., oxide) 118 adjacent to the pillar 170, the etch stop tier (e.g., ALOX) 108 of the vertical memory 200 may also comprise a plurality of dielectric films (e.g., oxide) 152 that may horizontally extend from the block dielectric 118 into the etch stop tier 108. The vertical memory 200 may be formed by processes similar to the processes described above with reference to FIG. 3A to FIG. 3M. One difference between the processes for forming the memory 100 and the memory 200 may include the formation of the dielectric films 152 for the vertical memory 200 (as shown in FIG. 4A).

FIG. 4 shows the vertical memory 200 after a formation of a separation dielectric (e.g., oxide) 104 on a source (e.g., doped poly or WSiX) 102, a select gate source (P-type poly) 106 on the separation dielectric 104, an etch stop tier 108 including alternating ALOX tiers 118 and dielectric films (e.g., oxide) 152 on the select gate source 106, a stack 180 of alternating dielectric tiers (e.g., oxide) 110 and conductive tiers (e.g., N-type poly) 112 on the etch stop tier 108.

Other processes of forming the vertical memory 200 may be similar to or identical to the processes of forming the vertical memory 100 as shown in FIGS. 3B-3M.

Figure 5:
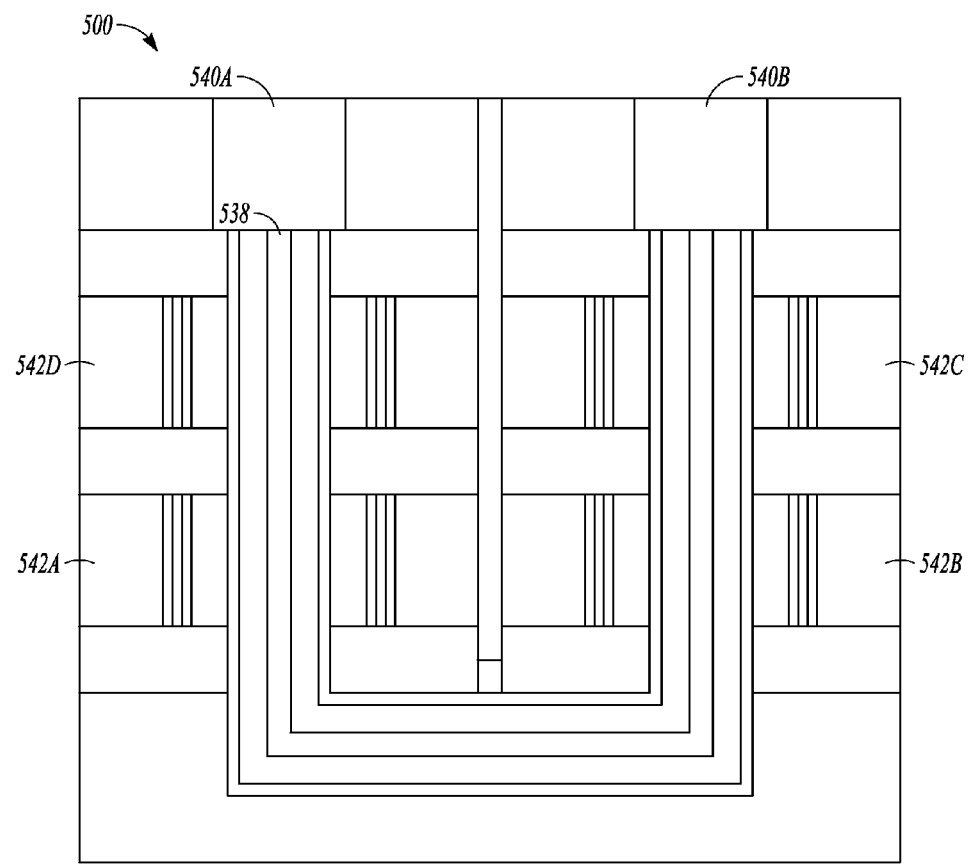
FIG. 5 illustrates an example of a memory array.

FIG. 5 shows an example of a memory array 500. In the memory array 500, memories 542A-D can be electrically coupled through a pillar 538. The pillar 538 can be electrically coupled to one or more data line contacts 540A-B. Memories 542A-D of the memory array 500 can be substantially similar to the vertical memories 100 or the vertical memories 200 discussed herein, such as those shown in FIGS. 1 and 2.

As shown in FIG. 5 a vertical memory array 500 can comprise a plurality of vertical memories. The memory array can comprise a vertical pillar 170 extending to a source 102, an etch stop tier 108 over the source 102, and a stack of alternating dielectric tiers 110 and conductive tiers 112 over the etch stop tier 108, as shown in FIGS. 1 and 2. The vertical pillar 170 (e.g., as shown in FIGS. 1 and 2) may be connected to more than one vertical memories (e.g., memories 100 or 200 as shown in FIGS. 1 and 2).

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The invention claimed is:

1. A memory comprising:
a vertical pillar coupled to a source;
a dielectric etch stop tier over the source, the dielectric etch stop tier comprising a blocking dielectric adjacent to the pillar, and a plurality of dielectric films horizontally extending from the blocking dielectric into the dielectric etch stop tier and separating the dielectric etch stop tier into multiple dielectric tiers; and
a stack of alternating dielectric tiers and conductive tiers over the dielectric etch stop tier.

2. The memory of claim 1, wherein the etch stop tier comprises Aluminum Oxide (ALOX).

3. The memory of claim 1, wherein the blocking dielectric comprises silicon oxide.

4. The memory of claim 1, wherein at least one of the conductive tiers includes a control gate, a charge storage structure adjacent to the pillar, and a barrier film between the control gate and the charge storage structure.

5. The memory of claim 4, wherein the control gate and the charge storage structure comprise polysilicon.

6. The memory of claim 4, wherein the barrier film comprises oxide-nitride-oxide (ONO).

7. The memory of claim 1, further comprising a select gate source (SGS) between the etch stop tier and the source, wherein the select gate source tier comprises polysilicon.

8. The memory of claim 7, further comprising a separation tier between the source and the select gate source, wherein the separation tier comprises silicon oxide.

9. The memory of claim 1, wherein the pillar comprises polysilicon.

10. The memory of claim 1, wherein the pillar comprises a sidewall, and wherein the sidewall comprises silicon oxide.

11. A memory comprising:
a vertical pillar extending to a source;
a dielectric etch stop tier over the source, the dielectric etch stop tier comprising a blocking dielectric adjacent to the pillar, and a plurality of dielectric films horizontally extending from the blocking dielectric into the dielectric etch stop tier and separating the dielectric etch stop tier into multiple dielectric tiers; and
a stack of alternating dielectric tiers and conductive tiers over the dielectric etch stop tier, wherein at least one of the conductive tiers includes a control gate, and a charge storage structure adjacent to the pillar.

12. The memory of claim 11, wherein the plurality of dielectric films comprise silicon oxide.

13. The memory of claim 11, wherein the conductive tier further comprises a barrier film between the control gate and the charge storage structure.

14. The memory of claim 11, wherein the charge storage structure comprises a floating gate.

15. A vertical memory array comprising:
a plurality of vertical memories;
a vertical pillar coupled to the vertical memories, the pillar extending to a source;
a dielectric etch stop (ES) tier over the source, the dielectric etch stop tier comprising a blocking dielectric adjacent to the pillar, and a plurality of dielectric films horizontally extending from the blocking dielectric into the dielectric etch stop tier and separating the dielectric etch stop tier into multiple dielectric tiers; and
a stack of alternating dielectric tiers and conductive tiers over the dielectric etch stop tier.

16. The memory array of claim 15, wherein at least one of the conductive tiers includes a control gate, a floating gate adjacent to the pillar, and a barrier film between the control gate and the floating gate.

17. The memory array of claim 15, wherein the memories comprise NAND memories.

\* \* \* \* \*